United States Patent
Zhang et al.

(10) Patent No.: US 9,679,625 B2
(45) Date of Patent: Jun. 13, 2017

(54) PERPENDICULAR MAGNETIC TUNNEL JUNCTION (PMTJ) WITH IN-PLANE MAGNETO-STATIC SWITCHING-ENHANCING LAYER

(71) Applicant: Avalanche Technology, Inc., Fremont, CA (US)

(72) Inventors: Jing Zhang, Los Altos, CA (US); Yiming Huai, Pleasanton, CA (US); Rajiv Yadav Ranjan, San Jose, CA (US); Yuchen Zhou, San Jose, CA (US); Zihui Wang, Milpitas, CA (US); Xiaojie Hao, Milpitas, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/930,523

(22) Filed: Nov. 2, 2015

(65) Prior Publication Data

US 2016/0055893 A1   Feb. 25, 2016

Related U.S. Application Data

(63) Continuation of application No. 13/161,412, filed on Jun. 15, 2011, now Pat. No. 9,196,332, which is a (Continued)

(51) Int. Cl.
*H01L 29/82* (2006.01)
*G11C 11/16* (2006.01)
*H01L 43/08* (2006.01)
*H01L 43/02* (2006.01)
*H01L 43/10* (2006.01)

(52) U.S. Cl.
CPC ............ *G11C 11/161* (2013.01); *G11C 11/16* (2013.01); *G11C 11/1675* (2013.01);
(Continued)

(58) Field of Classification Search
CPC ............................... G11C 11/161; G11C 11/16
See application file for complete search history.

(56) References Cited

U.S. PATENT DOCUMENTS 5,966,323 A    10/1999  Chen et al.
6,803,615 B1   10/2004  Sin et al.
(Continued)

*Primary Examiner* — Marc Armand
*Assistant Examiner* — Sarah Salerno
(74) *Attorney, Agent, or Firm* — Maryam Imam; Bing K. Yen

(57) ABSTRACT

An STTMRAM element includes a magnetic tunnel junction (MTJ) having a perpendicular magnetic orientation. The MTJ includes a barrier layer, a free layer formed on top of the barrier layer and having a magnetic orientation that is perpendicular and switchable relative to the magnetic orientation of the fixed layer. The magnetic orientation of the free layer switches when electrical current flows through the STTMRAM element. A switching-enhancing layer (SEL), separated from the free layer by a spacer layer, is formed on top of the free layer and has an in-plane magnetic orientation and generates magneto-static fields onto the free layer, causing the magnetic moments of the outer edges of the free layer to tilt with an in-plane component while minimally disturbing the magnetic moment at the center of the free layer to ease the switching of the free layer and to reduce the threshold voltage/current.

18 Claims, 8 Drawing Sheets

Related U.S. Application Data continuation-in-part of application No. 13/099,321, filed on May 2, 2011, now Pat. No. 8,565,010, which is a continuation-in-part of application No. 13/029,054, filed on Feb. 16, 2011, now Pat. No. 8,598,576.

(52) U.S. Cl.
CPC .............. *H01L 43/02* (2013.01); *H01L 43/08* (2013.01); *H01L 43/10* (2013.01)

(56) References Cited

U.S. PATENT DOCUMENTS

| | | |
|---|---|---|
| 7,573,737 B2 | 8/2009 | Kent et al. |
| 7,813,202 B2 | 10/2010 | Rodmacq et al. |
| 8,593,862 B2 | 11/2013 | Ranjan et al. |
| 2005/0185455 A1 | 8/2005 | Huai |
| 2008/0088980 A1 | 4/2008 | Kitagawa et al. |
| 2008/0191295 A1* | 8/2008 | Ranjan ............... B82Y 25/00 257/421 |
| 2008/0259508 A2 | 10/2008 | Kent et al. |
| 2009/0251829 A1* | 10/2009 | Zhang ............... B82Y 10/00 360/319 |
| 2010/0096716 A1 | 4/2010 | Ranjan et al. |
| 2010/0315863 A1* | 12/2010 | Zhu ............... B82Y 25/00 365/158 |
| 2011/0318848 A1* | 12/2011 | Choi ............... G11C 11/16 438/3 |
| 2012/0205760 A1* | 8/2012 | Zhou ............... H01L 29/66984 257/421 |

\* cited by examiner

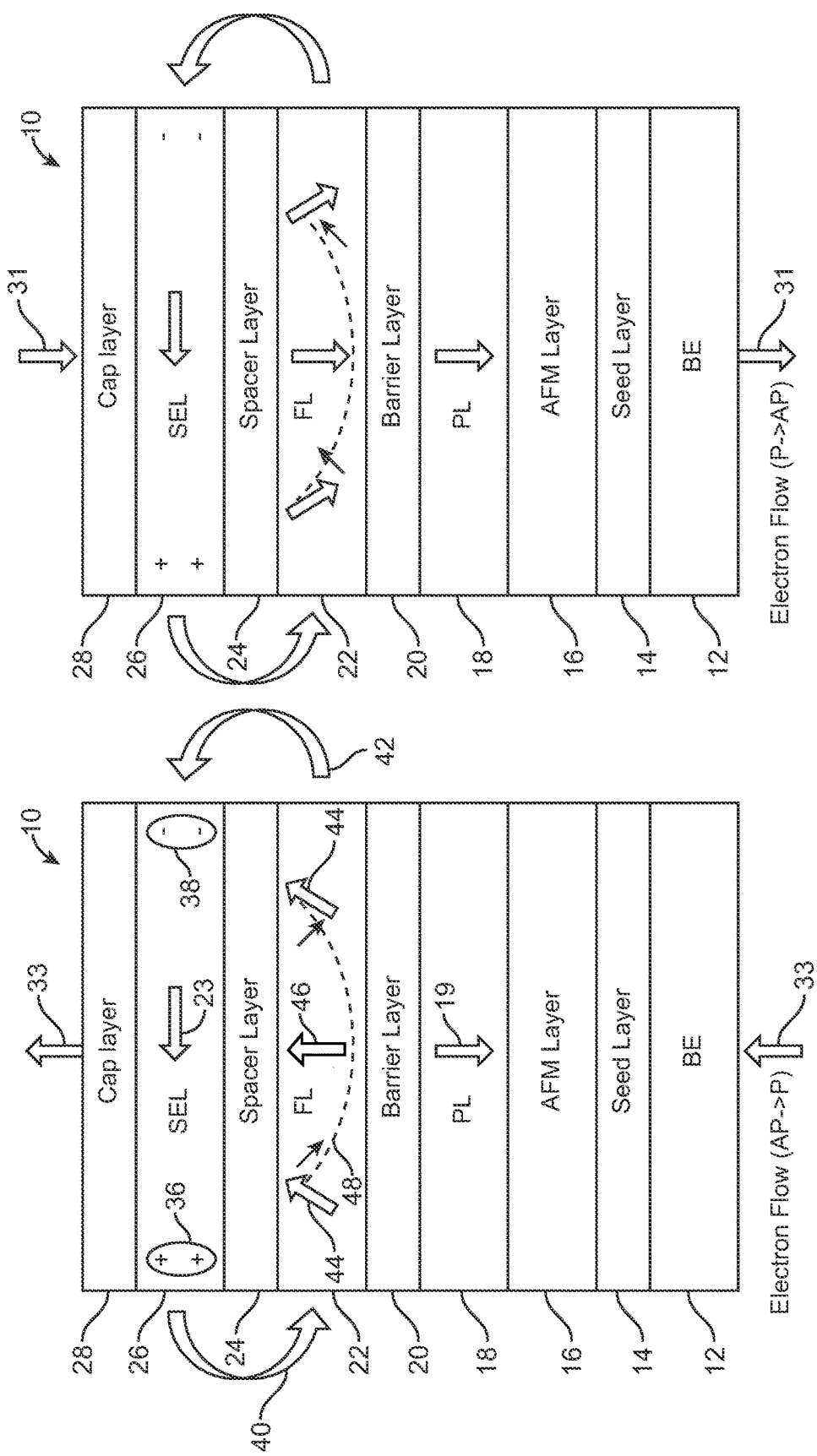

PERPENDICULAR MAGNETIC TUNNEL JUNCTION (PMTJ) WITH IN-PLANE MAGNETO-STATIC SWITCHING-ENHANCING LAYER

CROSS REFERENCE TO RELATED APPLICATIONS

The present application is a continuation of the commonly assigned application bearing Ser. No. 13/161,412 filed on Jun. 15, 2011, entitled "PERPENDICULAR MAGNETIC TUNNEL JUNCTION (pMTJ) WITH IN-PLANE MAGNETO-STATIC SWITCHING-ENHANCING LAYER," which is a continuation-in-part of a previously-filed continuation-in-part (CIP) U.S. patent application Ser. No. 13/099,321, filed on May 2, 2011, by Zhou et al. and entitled "Magnetic Random Access Memory With Field Compensation Layer and Multi-Level Cell", which is a CIP of U.S. patent application Ser. No. 13/029,054, filed on Feb. 16, 2011, by Zhou et al. and entitled "Magnetic Random Access Memory With Field Compensation Layer and Multi-Level Cell".

BACKGROUND OF THE INVENTION

Field of the Invention

The present invention relates generally to a magnetic memory element having a magnetic tunnel junctions (MTJ) and particularly to a magnetic memory element having an MTJ with perpendicular anisotropy.

Background

Magnetic random access memory (MRAM) is rapidly gaining popularity as its use in replacing conventional memory is showing promise. Magnetic tunnel junctions (MTJs), an essential part of the MRAM, used to store information, are made of various layers, at least some of which determine the magnetic characteristic of the MRAM. An exemplary MTJ uses spin transfer torque to effectuate a change in the direction of magnetization of one or more free layers in the MTJ. That is, writing a bit ("1" or "0" in digital logic) of information is achieved by using a spin polarized current flowing through the MTJ, instead of using a magnetic field, to change states or program/write/erase the MRAM.

In spin transfer torque (STT) MTJ designs, when electrons flow across the MTJ stack, which is commonly referred to as "MTJ", in a direction that is perpendicular to the film plane or from the pinned (sometimes referred to as "reference" or "fixed") layer to the free (sometimes referred to as "switching" or "storage") layer, spin torque from electrons transmitted from the pinned layer to the free layer orientates the free layer magnetization in a direction that is parallel to that of the reference (or pinned) layer. When electrons flow from the free layer to the pinned layer, spin torque from electrons that are reflected from the pinned layer back into the free layer orientates the free layer magnetization to be anti-parallel relative to the magnetization of the pinned layer. Thus, controlling the electron (current) flow direction causes switching of the direction of magnetization of the free layer. Resistance across the MTJ stack changes between low and high states based on the magnetization of the free layer, i.e. parallel versus anti-parallel, relative to that of the pinned layer.

However, a problem consistently experienced and preventing advancement of the use of MTJs in STTMRAM designs is reducing the threshold voltage or current used to switch the free layer magnetization during write operations. Such current and threshold voltage requirements limit the use of spin transfer torque-based MTJ devices in practical applications.

MTJs with perpendicular anisotropy, such that the magnetic moments of the free layer and the fixed layer thereof are in perpendicular directions relative to the plane of the film, are more appealing than their in-plane anisotropy counterparts largely due to the density and thermal stability improvements realized by the former.

While attempts are made to reduce the switching current and voltage of the MTJ, such attempts have largely addressed in-plane MTJ designs and not perpendicular MTJs. One way to reduce the switching current and voltage is to ease the switching of the free layer of an MTJ. Existing perpendicular MTJ designs include a free layer whose magnetic orientation (also referred to as anisotropy) relative to a reference ("fixed") layer, while perpendicular in direction, has high effective coercivity field (Hc). Effective Hc throughout the free layer is non-uniform. That is, effective perpendicular coercivity field (Hc) of the free layer changes relative to the position within the free layer such that the center of the free layer generally has a lower effective Hc than the outer edges of the free layer with effective Hc essentially increasing from the center of the free layer to its outer edges.

Lower effective Hc of the free layer would allow easier switching of the free layer and would lower the threshold voltage and current required to switch the magnetization of the free layer.

Thus, the need arises for decreasing the overall effective perpendicular anisotropic field of the free layer of magnetic memory element and thereby reducing the threshold voltage and current required to operate the same, with minimal impact on thermal stability of the free layer.

SUMMARY OF THE INVENTION

Briefly, a spin transfer torque magnetic random access memory (STTMRAM) element has a perpendicular magnetic orientation and is configured to store a state when electrical current is applied thereto. The STTMRAM element includes a seed layer, a magnetic tunnel junction (MTJ) with a perpendicular magnetic orientation including, a pinned layer with anti-ferromagnetic (AFM) layer formed on top of the seed layer and having a fixed perpendicular magnetic orientation, a barrier layer formed on top of the pinned layer, and a free layer formed on top of the barrier layer. The free layer has a magnetic orientation that is perpendicular and switchable relative to the magnetic orientation of the fixed layer. The magnetic orientation of the free layer switches when electrical current flows through the STTMRAM element. A switching-enhancing layer (SEL) is formed on top of the MTJ. The SEL has an in-plane magnetic orientation and generates magneto-static fields onto the free layer, causing the magnetic moments of the outer edges of the free layer to tilt with an in-plane component while minimally disturbing the magnetic moment at the center of the free layer to ease the switching of the free layer and to reduce the threshold voltage/current.

These and other objects and advantages of the present invention will no doubt become apparent to those skilled in the art after having read the following detailed description of the various embodiments illustrated in the several figures of the drawing.

IN THE DRAWINGS

FIG. 3 shows the STTMRAM element 10 when current is applied with electrons flowing from the BL 12 to the cap layer 28 and the element 10 is switching states from anti-parallel to parallel.

FIG. 4 shows the element 10 experiencing the application of electron flow, shown in a direction by the arrows 31, to be applied at the cap layer 28, flowing through the rest of the element 10, to the BL 12.

Figure 5:
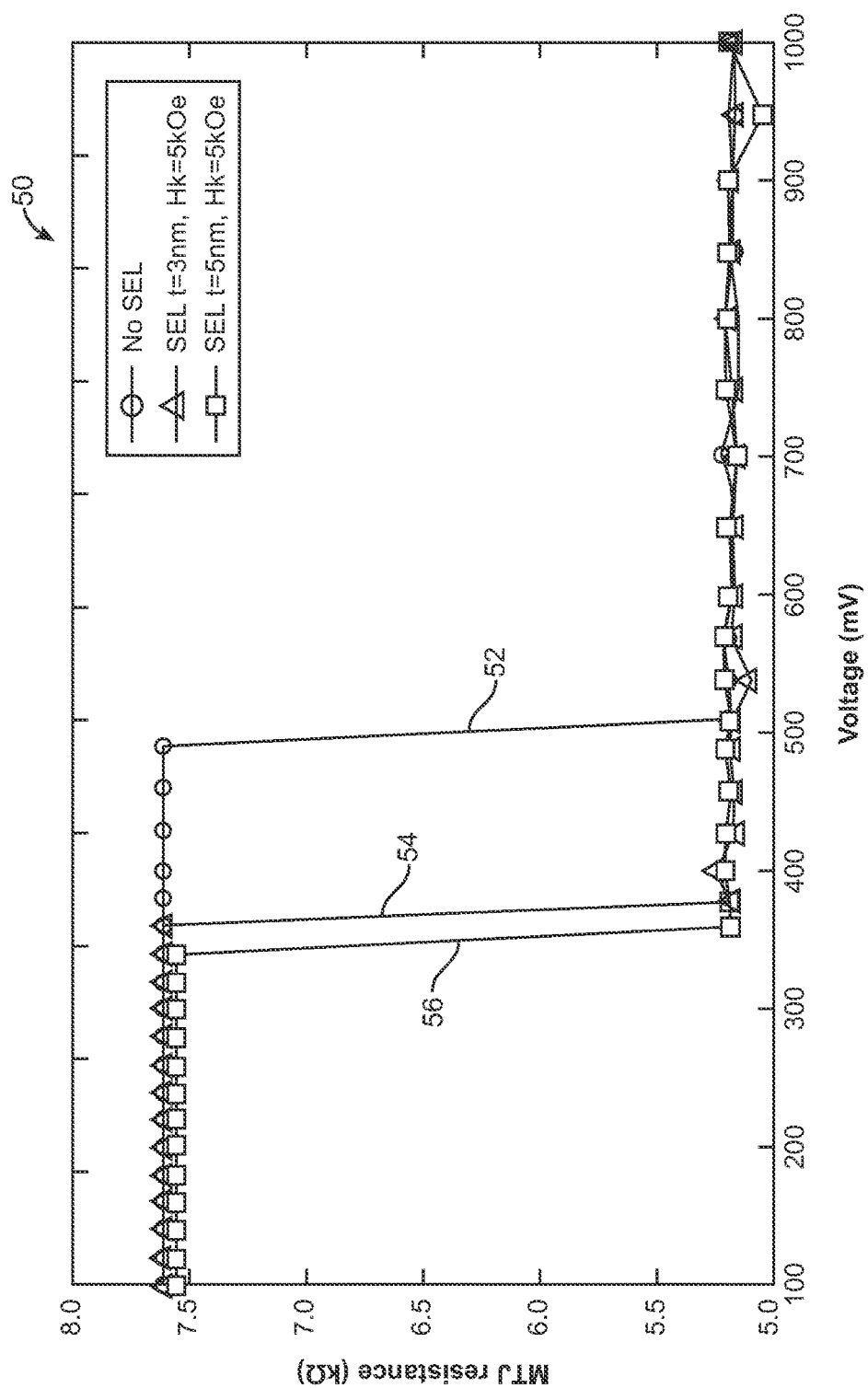

FIG. 5 shows a graph 50 of the characteristics of the elements 10 and 30 having different thicknesses vs. prior art magnetic elements.

Figure 6:
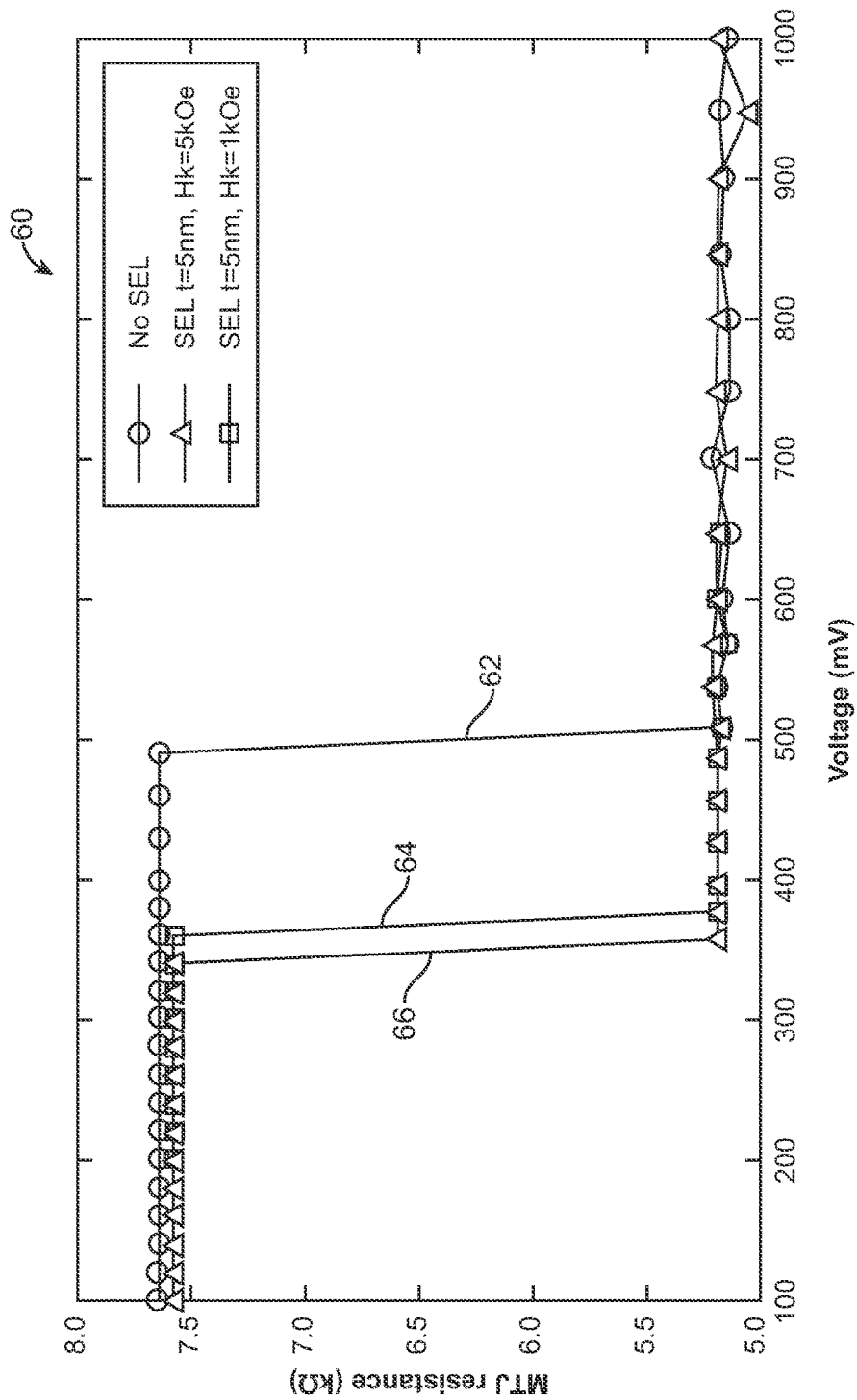

FIG. 6 shows a graph 60 of the characteristics of the elements 10 and 30 having different Hk vs. prior art magnetic elements.

Figures 7, 8:
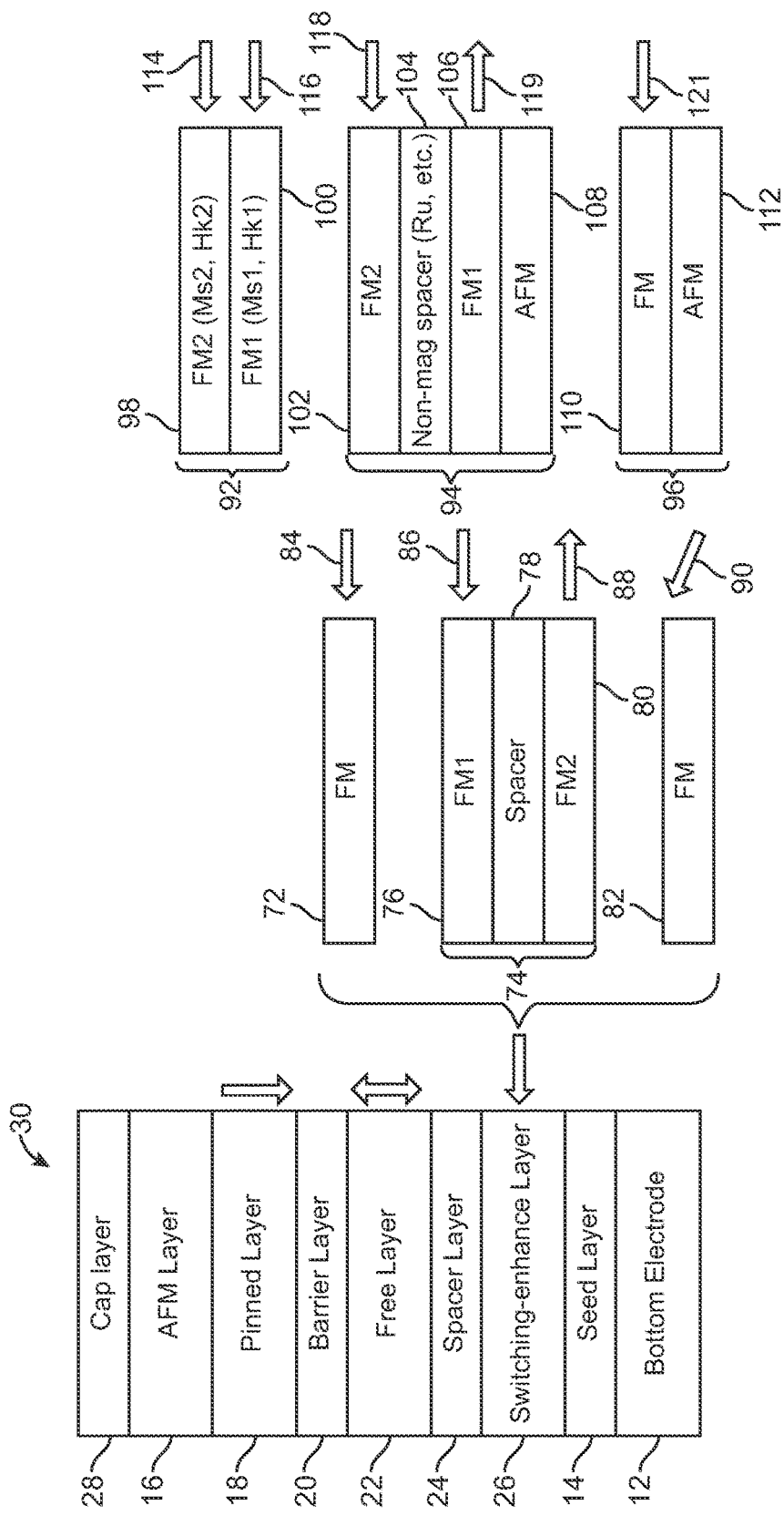

FIG. 7 shows the element 10 to include various embodiments of the SEL 26.

FIG. 8 shows the element 10 to include still further embodiments of the SEL 26.

Figure 9:
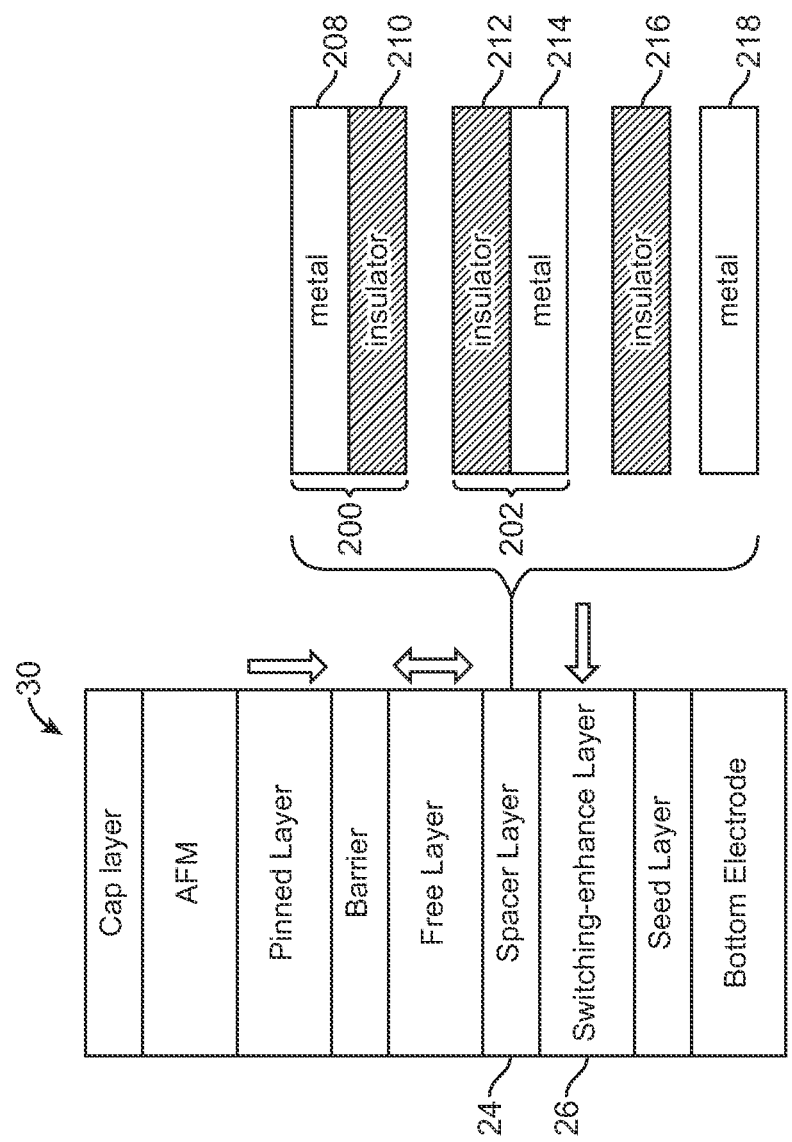

FIG. 9 shows the element 10 to include various embodiments of the layer 24.

Figure 10:
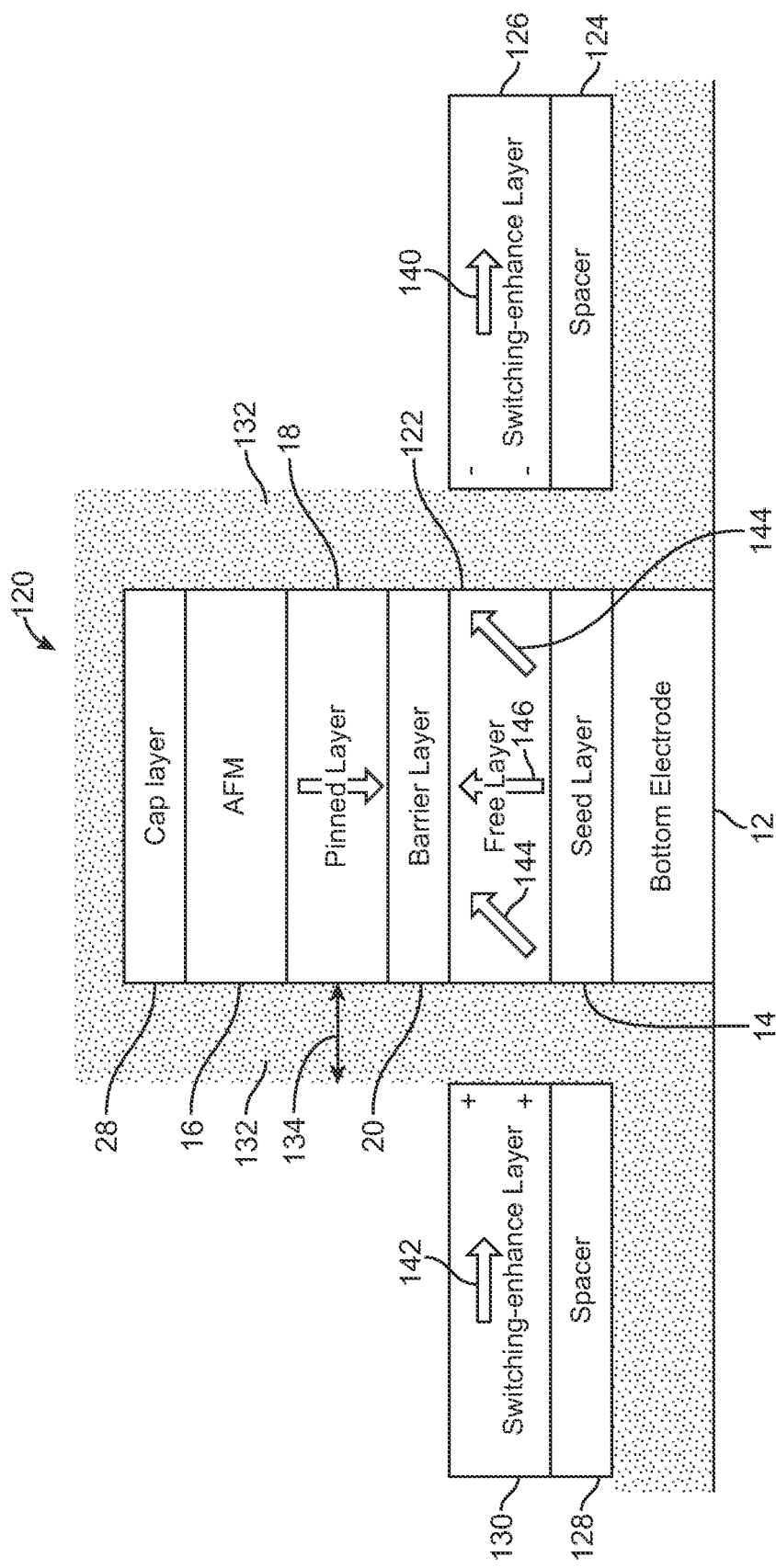

FIG. 10 shows the relevant portion of an STTMRAM element 120 in accordance with another embodiment of the present invention.

Figure 11:
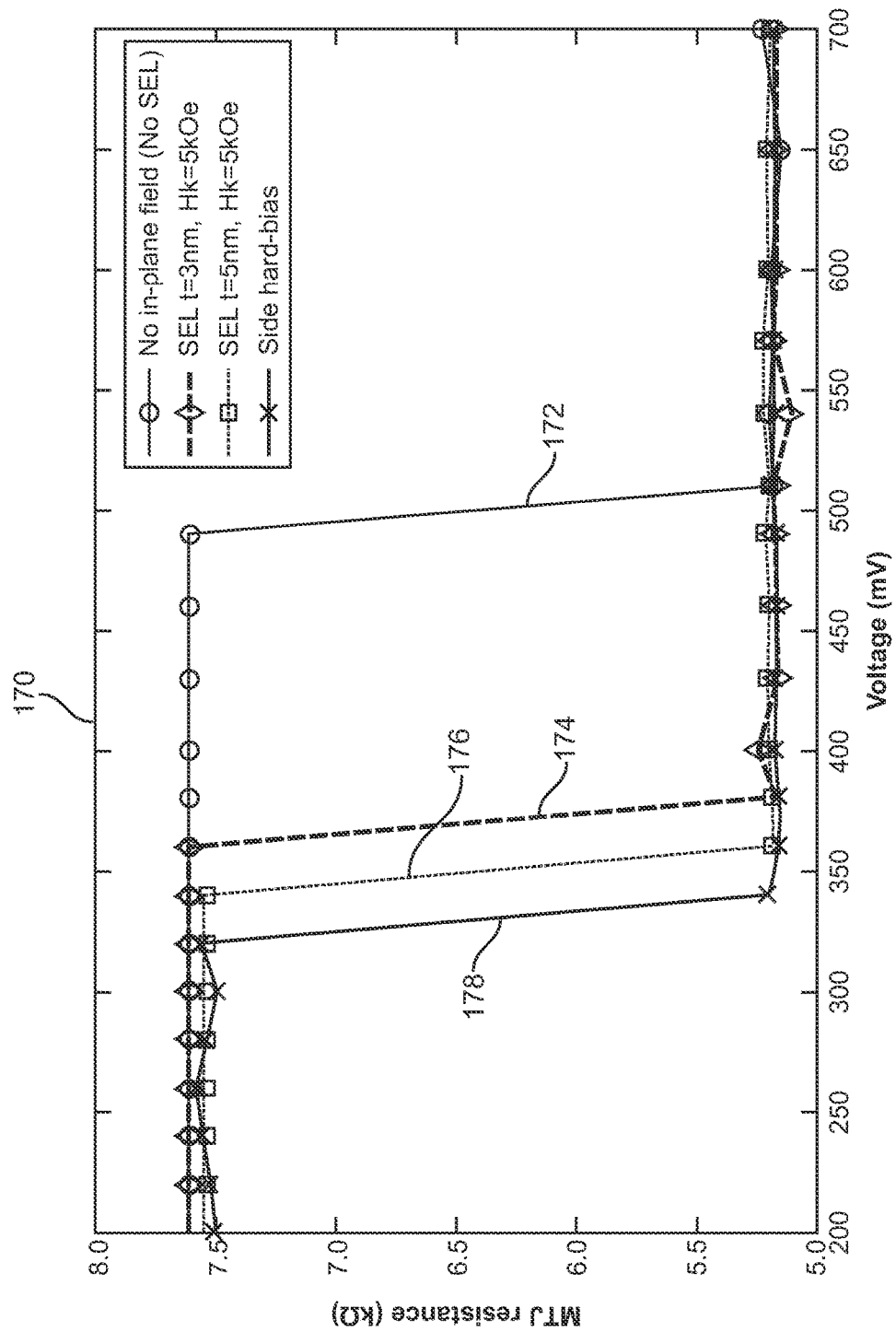

FIG. 11 shows a graph 170 of the behavior of the element 120 vs. that of a prior art magnetic memory.

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention, a spin transfer torque magnetic random access memory (STTMRAM) element and a method of manufacturing the same is disclosed. The STTMRAM element has a substantially perpendicular magnetic orientation and is configured to program (or write) a state. Relevant layers of the STTMRAM element include a seed layer and a magnetic (also referred to as "magneto") tunnel junction (MTJ) having a perpendicular magnetic anisotropy. The MTJ includes a pinned layer with anti-ferromagnetic (AFM) layer, which is formed on top of the seed layer, with a perpendicular fixed magnetic orientation. The MTJ further includes a barrier layer formed on top of the pinned layer and a free layer formed on top of the barrier layer with the free layer having a magnetic orientation that is substantially perpendicular relative to the film plane and switchable relative to the magnetic orientation of the fixed layer. The magnetic orientation of the free layer switches when electrical current flows through the STTMRAM element. The free layer, by itself, has a magnetic moment in a direction substantially perpendicular relative to the substrate at its center, and further has magnetic moments at its outer edges that are also substantially perpendicular relative to the substrate in their magnetic directions. A switching-enhancing layer (SEL), along with a spacer layer, is formed on top of the free layer and has an in-plane magnetic orientation. The SEL generates magneto-static fields affecting the outer edges of the free layer, causing the magnetization (or "magnetic orientation") of the free layer at its outer edges to have an in-plane component but minimally disturbing the magnetization at the center of the free layer. That is, magnetization at the outer edges of the free layer tilts with an in-plane component, caused by the magneto-static field from the SEL, thereby resulting in stronger spin torque at the outer edges to initiate the magnetization switching at the outer edges of the free layer. Moreover, through intra-layer exchange coupling, magnetization switching at the outer edges propagates to the center of the free layer and starts the switching of the magnetization at the center of the free layer. The latter is in addition to the switching of magnetization at the center of the free layer owing to the spin torque associated therewith. This advantageously results in easier switching of the free layer with a free layer edge magnetic moment that is tilted with in-plane component rather than a magnetic moment that is completely perpendicular.

Figures 1, 2:
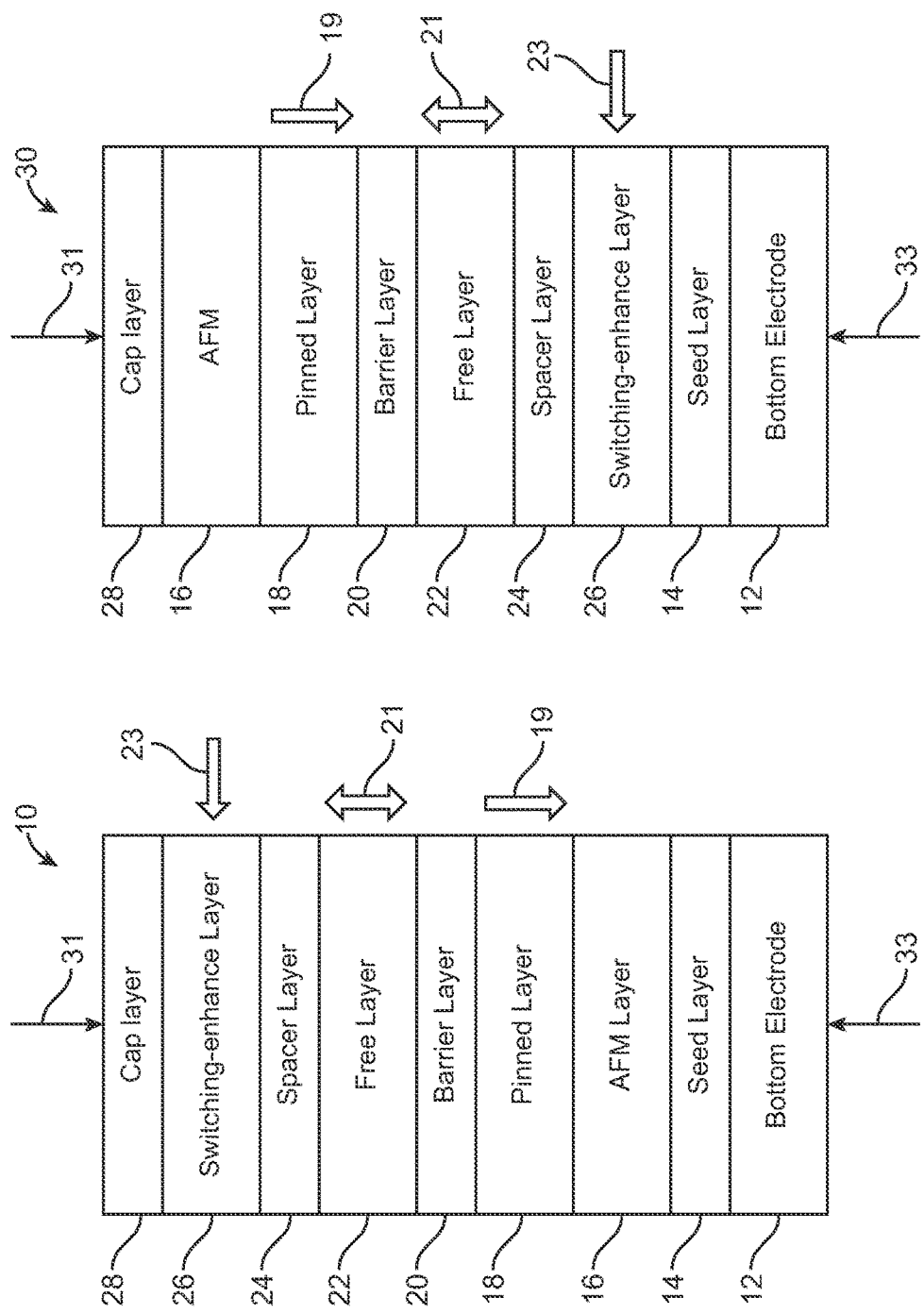
FIG. 1 shows the relevant portion of a spin transfer torque magnetic random access memory (STTMRAM) element 10, in accordance with an embodiment of the present invention.
FIG. 2 shows the relevant portion of an STTMRAM element 30, in accordance with another embodiment of the present invention.

FIG. 1 shows the relevant portion of a spin transfer torque magnetic random access memory (STTMRAM) element 10, in accordance with an embodiment of the present invention. The STTMRAM element 10 is shown to include a bottom electrode (BE) 12 on top of which is shown formed a seed layer 14, on top of which is shown formed an anti-ferromagnetic layer 16, on top of which is shown formed a pinned layer (PL) 18, on top of which is shown formed a barrier layer 20, on top of which is shown formed a free layer (FL) 22, on top of which is shown formed a spacer layer 24, on top of which is shown formed a switching-enhancing layer 26, on top of which is shown formed a cap layer 28. It is noted that the layer 28 also serves as the top electrode, readily known to those in the field.

It is noted that the pinned layer 18 is sometimes referred to as a "fixed layer" and the barrier layer 20 is sometimes referred to as a "tunnel layer" or a "barrier tunnel layer" or a "tunnel barrier layer" and the free layer 22 is sometimes referred to as a "switching layer" or "memory layer" or "storage layer" and the spacer layer 24 is sometimes referred to as a "separator layer" and the cap layer 28 is sometimes referred to as a "capping layer". It is understood that other layers, not shown in FIG. 1, may be and are typically formed on top of the layer 28, below the layer 12 and/or in between any of the layers shown in FIG. 1. It is also understood that the same applies to alternative embodiments shown and discussed herein relative to subsequent figures. It is further understood that the BE 12 is formed on top of a substrate and semiconductor device layers not shown in FIG. 1 but well known to those in the art.

The layer 18 is shown to have a magnetic moment (also known as "magnetization") in a direction shown by the arrow 19, the layer 22 is shown to have a magnetic moment in a direction shown by the arrow 21 and the layer 26 is shown to have a magnetic moment in a direction shown by the arrow 23. Electrons flow into the element 10, either at 31 or at 33, during read and write operations. It is noted that electrical current is applied to the element 10, during a write operation, at 31 and 33 but in a direction that is opposite to the direction of electron flow. The element 10 is generally used to store digital information (or data) during write or program operations and this information is read during read operations. For these operations, various devices are coupled to the element 10 that are not shown in FIG. 1, such as an access transistor, known to those in the art. For a description of these devices and methods of reading from and writing to the element 10, the reader is directed to U.S. patent application Ser. No. 11/674,124, filed on Feb. 12, 2007, by Rajiv Yadav Ranjan, and entitled "Non-Uniform Switching Based Non-Volatile Magnetic Based Memory", the disclosures of which are incorporated herein by reference.

The element 10 has a perpendicular anisotropy in that the layer 22 has a magnetic moment that is perpendicular relative to the film plane. Similarly, the layer 18 has such a perpendicular anisotropy. The element 10 switches states to store a digital value in correspondence with the magnetic orientation of the layer 22 in that when this orientation is parallel to the magnetic orientation of the layer 18, the element 10 is in one state ("0" or "1"), generally referred to as "parallel", and when the orientation of the layer 22 is anti-parallel, relative to the orientation of the layer 18, the element 10 is in an opposite state. These different states result in unique resistances across the element 10. In this manner, the digital value of "1" or "0" is distinguished during read operations.

In some embodiments, the BE 12 is made of tantalum (Ta), tantalum nitride (TaN), titanium nitride (TiN), ruthenium (Ru) or copper (Cu), the layer 14 is made of one or more elements from tantalum (Ta), titanium (Ti), niobium (Nb), nickel (Ni), molybdenum (Mo), vanadium (V), tungsten (W), silicon (Si), copper (Cu), aluminum (Al) chromium (Cr), Ru, or multilayers made of any combination of these materials. The layer 16 is made of platinum manganese (PtMn), iron manganese (FeMn), or iridium manganese (IrMn), and the layer 18 is made of Co, iron or Ni or an alloy made from a combination thereof or from Co, Fe, Ni or X or any combination thereof and where X is one or a combination of non-magnetic elements such as chromium (Cr), platinum (Pt), tantalum (Ta), titanium (Ti), tungsten (W), boron (B), vanadium (V), niobium (Nb), nickel (Ni), molybdenum (Mo), tungsten (W), silicon (Si), copper (Cu), aluminum (Al), gallium (Ga), platinum (Pt), palladium (Pd), samarium (Sm), oxygen (O), and nitrogen (N). Similarly, the layer 22 is made of a material typically used by the industry for making a free layer, as is the layer 20 made of a material known for making a tunnel layer.

It should be noted that while the embodiments of FIGS. 1 and 2 each show an AFM layer adjacent to the pinned layer, in certain embodiments this layer may not be present. In such case, one or more seed layers may be introduced in place of the AFM layer 16 to facilitate better crystal growth of the pinned layer, leading to a higher anisotropy.

While the layers 22 and 18 are each shown to be made of a single layer, in alternate embodiments, each of these layers may be made of multiple layers or one layer can be made of a single layer and the other can be made of multiple layers. Additionally and still alternatively, each of the layers 22 and 18 may be made of synthetic anti-ferromagnetic materials. Additionally, it should be noted that a thin layer of CoFeB, typically less than 2 nm thick, is introduced on either side of the barrier layer 20, and between layers 20 and 22, and layers 20 and 18 to enhance the spin polarization, leading to a higher TMR. In one embodiment, about 1 nm thick $Co_{20}Fe_{60}B_{20}$ was introduced on either side of the barrier layer 20.

The layer 24 is a non-magnetic layer and is advantageously non-spin-depolarizing, which causes the element 10 to be set apart from prior art MRAM structures because in the latter case, even when using a spacer layer, this layer has to be non-spin-depolarizing. Non-spin-depolarizing refers to electron spin not being disturbed or flipped when passing through the layer. Additionally, the element 10 is set apart from prior art in-plane MRAM structures with spin polarizer due to its perpendicular anisotropy.

The layers 16, 18, 20 and 22 define the MTJ of the element 10 and due to the magnetization orientation of the FL 22 and the PL 18, the MTJ of the element 10 is considered to be a perpendicular MTJ (pMTJ).

As will be shown in greater detail shortly and discussed further, the SEL 26 advantageously causes the switching (also referred to herein as the "threshold") current/voltage required to program the element 10 to also be reduced. In some cases, such a decrease is 20-25% or more over prior art structures that do not use the SEL 26. As shown by the arrow 23, the direction of magnetization of the SEL 26 is in-plane and not perpendicular, this is important in the influence the SEL 26 has on the FL 22 relative to reducing the overall effective Hc of the FL 22, which contributes to the reduction of the current and voltage required to switch the element 10.

The structure of the element 10 is considered to be a "bottom structure" because the FL 22 is shown formed on top of the PL 18. In the case where an STTMRAM element has a top structure, the free layer thereof is formed below its pinned layer, as shown in FIG. 2.

FIG. 2 shows the relevant portion of an STTMRAM element 30, in accordance with another embodiment of the present invention. The element 30 is analogous to the element 10 except that it has a "top structure" with the pinned layer 18 formed on top of the free layer 22. Similarly, some of the other layers are positioned differently in that the seed layer 14 is shown formed on top of the BE 12, the SEL 26 is shown formed on top of the seed layer 14, the spacer layer 24 is shown formed on top of the SEL 26, the FL 22 is shown formed on top of the spacer layer 24, the barrier layer 20 is shown formed on top of the FL 22, the PL 18 is shown formed on top of the barrier layer 20, the AFM layer 16 is shown formed on top of the PL 18 and the cap layer 28 is shown formed on top of the AFM layer 16.

FIG. 3 shows the STTMRAM element 10 when current is applied with electrons flowing from the BE 12 to the cap layer 28 and the element 10 is switching states from anti-parallel to parallel. The SEL 26 is shown to generate magneto-static field, shown by the arrows 40 and 42, on mostly the edges of the FL 22 causing tilting of the magnetization with an in-plane component at the outer edges of the FL 22 yet resulting in minimal disturbance of the magnetization at the center of the FL 22. The magnetization at the edges of the FL 22 are shown by the arrows 44 and are substantially in a direction that is out-of-plane with small in-plane component while the magnetization at substantially the center of the free layer, shown by the arrow 46, is perpendicular relative to the plane of the film. It is noted that the longitudinal demagnetization field from the SEL 26 is stronger at the edges of the FL 22 and decays at the center of the FL 22 as shown by the dashed line 48 in FIG. 3. In this respect, while the magnetization at the outer edges of the FL 22 is tilted in the presence of the SEL 26, the magnetization at the center of the FL 22 is less affected and remains substantially perpendicular. In FIG. 3, the SEL 26 is shown to have a positive magnetic charge 36 on its left side, indicated by the symbol "+", and a negative magnetic charge 38 on its right side, indicate by the symbol "−".

In some embodiments, the SEL 26 has a thickness of 1 nm to 10 nm.

With the electron flow shown by the arrow 33, the majority of the electrons with spin polarized by the pinned layer are transmitted through the barrier to the free layer. Spin momentum exerts larger spin torque at the outer edges of the FL 22 to assist switching. Advantageously, in operation, the magnetic moment, shown by the arrow 44 is tilted with an in-plane component having a large torque contributing to switching and the magnetization 46, at the center of the FL 22, switches following edge switching through the intra-layer exchange coupling thereof. The SEL 26 causes easing of the switching of the FL 22 by providing an in-plane biasing field at the outer edges of the FL 22, which effectively reduces the required switching current.

FIG. 4 shows the element 10 experiencing the application of switching or electrical current with electron flow, shown in a direction by the arrows 31, to be applied at the cap layer 28, flowing through the rest of the element 10, to the BE 12. In the embodiment of FIG. 4, the element 10 switches from a parallel state to an anti-parallel state. The electrons with a spin not aligned with the pinned layer are back-scattered to reverse the free layer magnetic orientation.

FIG. 5 shows a graph 50 including a y-axis representing the resistance, in kilo ohms, of the MTJ of various STTM-RAM elements and an x-axis representing the voltage, in milli volts, applied to the STTMRAM elements. The voltage in the x-axis is the voltage referred to herein as the "threshold voltage" and it is the voltage at which the STTMRAM element changes resistance. The curve 52 shows the simulated performance of a conventional pMTJ element with no SEL while the curve 54 shows the simulated performance of the element 10 and the element 30 where the SEL 26 is 3 nano meters in thickness and the magnetic anisotropy, Hk, thereof is 5 kOe. As shown in FIG. 5, there is somewhere between a 20-25% reduction in the voltage (and current) required to switch each of the elements 10 and 30 than that of a counterpart prior art element.

The curve 56 shows the performance of the elements 10 and 30 where the SEL 26 is 5 nano meters in thickness and as shown, the thicker SEL yields more voltage reduction. For example, a 20 milli volt reduction is shown by the curve 56. It is noted that generally, the thicker the SEL 26, the more effective the current reduction realized but the more challenge in forming the MTJ due to the etching process involved.

FIG. 6 shows a graph 60 of the characteristics of the elements 10 and 30 vs. prior art magnetic elements. In FIG. 6, the x-axis represents the threshold voltage, in milli volts, applied to the magnetic elements and the y-axis represents the MTJ resistance, in kilo Ohms, of the magnetic elements.

The curve 62 shows the behavior of a prior art magnetic element, whereas the curve 64 shows the behavior of the element 10 where the thickness of the SEL 26 is 5 nano meters and the Hk is 1 kOe. The curve 66 shows the behavior of the element 10 with the SEL 26 having a thickness of 5 nano meters and an Hk of 5 kOe. Again, there is a substantial reduction of threshold voltage/current experienced when the SEL 26 is employed over prior art magnetic memory. Additionally, the threshold voltage increases by 20 milli volts when the Hk is reduced from 5 kOe to 1 kOe. That is because a weakly-pinned SEL is another damping source for the FL 22 when it is switching. It is recommended that an Hk of 1 kOe or larger is an effective magnetic anisotropy required for the SEL 26.

FIG. 7 shows the elements 10 and 30 to include various embodiments of the SEL 26. In one embodiment, the SEL 26 is made of single layer 72 ferromagnetic (FM) material and has an in-plane anisotropy, as shown by the arrow 84. In this respect, in some embodiments, the SEL 26 is made of cobalt (Co), iron or nickel (Ni) or an alloy made from a combination thereof or from Co, Fe, Ni or X or any combination thereof and where X is one or a combination of non-magnetic elements such as chromium (Cr), platinum (Pt), tantalum (Ta), titanium (Ti), tungsten (W), boron (B), vanadium (V), niobium (Nb), nickel (Ni), molybdenum (Mo), tungsten (W), silicon (Si), copper (Cu), aluminum (Al), gallium (Ga), platinum (Pt), palladium (Pd), samarium (Sm), oxygen (O), and nitrogen (N). The direction of magnetization is set by a large external in-plane field without annealing.

In other embodiments, the SEL 26 is made of multiple layers 74 formed from a ferromagnetic layer 80 on top of which is formed a spacer layer 78, on top of which is formed a ferromagnetic layer 76. In this respect, the layers 76 and 80 are anti-ferromagnetically coupled (AFC). The layer 80 has an in-plane anisotropy, as shown by the arrow 88 and the layer 76 has an in-plane anisotropy, as shown by the arrow 86. In some embodiments, the layers 76 and 80 are each made of the same material as that disclosed above for the layer 72. In some embodiments, the spacer layer 78 is made of the same material as that disclosed for the spacer layer 24 herein. In this embodiment, the layers 74 comprise a synthetic anti-ferromagnetic (SAF) structure having an in-plane anisotropy (or magnetic orientation).

In some embodiments, the layer 80 is formed on top of the layer 14 and in other embodiments, the layer 74 is flipped with the layer 76 formed on top of the layer 14.

In still other embodiments, the SEL 26 is made of a FM layer 82 that is a single layer but has an out-of-plane magnetic anisotropy, as shown by the arrow 90 and in this respect is made of material that is different than the layer 72.

In some embodiments, the layer 82 is made of CoPtX where X is selected from one of the following materials: Cr, Ta, Mo, Zr, Nb, B, C, N, P, Ti, $SiO_2$, and $TiO_2$, and the magnetization of the layer 82 is tilted away from an in-plane direction to be greater than 10 degrees.

In this embodiment, the magnetization component of the layer 82 is controlled and tilted toward a perpendicular direction, as shown by the arrow 90. This helps to balance the anti-parallel to parallel vs. the parallel to anti-parallel switching current offset with controlled perpendicular field on the FL 22 from perpendicular magnetization component of the layer 82.

FIG. 8 shows the element 30 to include still further embodiments of the SEL 26. Accordingly, in one embodiment, the SEL 26 is made of bilayer 92, which is formed of a FM layer 100 on top of which is formed a FM layer 98. Each of the layers 98 and 100 is made of ferromagnetic material and have either a different magnetic isotropy (Hk) or a different saturation magnetization (Ms) or a different Hk and Ms relative to one another. The direction of magnetization of the layer 100 is in-plane and shown by the arrow 116 and the direction of magnetization of the layer 98, which is also in-plane, is shown by the arrow 114.

In yet another embodiment, the SEL 26 is made of the multi-layer 94, which is shown formed of an anti-ferromagnetic (AFM) layer 108 on top of which is shown formed a FM layer 106 on top of which is shown formed a spacer layer 104, on top of which is shown formed a FM layer 102. In this embodiment, the AFM layer 108 is formed on top of the layer 14. Alternatively, in a bottom MTJ structure configuration 10, the multi-layer 94 is flipped such that the FM layer 102 is formed on top of the layer 24 and the layer 104 is formed upon it and the layer 106 is formed on top of the layer 104 and the AFM layer 108 is formed on top of the layer 106. In both embodiments, the layers 106 and 102 are anti-ferromagnetically coupled.

In still another embodiment, the SEL 26 is made of the bilayer 96, which is shown made of an AFM layer 112 formed below a FM layer 110. The AFM layer 112 is made of the same material as the layers 108 and 16, and the FM layer 110 is made of the same material as the layer 72. The layer 112 helps the magnetic orientation (which is commonly referred to as "magnetization") of the layer 110 remain in the same direction. The direction of the magnetic orientation of the layer 110, which is in-plane, is shown by the arrow 121.

FIG. 9 shows the element 30 to include various embodiments of the layer 24. In one embodiment, the layer 24 is made of a bilayer 200, which is shown to be made of an insulator layer 210 below a metal layer 208. In the embodiment of FIG. 9, the layer 210 is formed on top of the SEL 26.

The layer 210 is made of any suitable insulating material, some examples of which are magnesium oxide (MgO), silicon dioxide ($SiO_2$), silicon nitride (SiN), and aluminum oxide ($Al_2O_3$). The layer 208 is made of any suitable metallic material, some examples of which are Ta, Ti, Ru, Pt, Cr, Cu, and Hf.

In other embodiments, the layers of the bilayer 200 are flipped, as shown by the bilayer 202 where the metal layer 214 is formed on top of the SEL 26 and the layer 212 is formed on top of the layer 214.

Still alternatively, the layer 24 is made of a single layer, which is made of the same material as the layer 210. To this end, the insulating layer 216 is shown as another embodiment.

Yet another embodiment of the element 10 is where the layer 24 is made of the metal layer 218, which is a single layer and made of the same material as the layer 208.

FIG. 10 shows the relevant portion of an STTMRAM element 120, in accordance with another embodiment of the present invention. The element 120 is shown to include the BE 12, the layer 14, the free layer 122, the layer 20, the layer 18, the layer 16, the layer 28, a spacer layer 124, an SEL layer 126, a spacer layer 128 and an SEL 130. The layers 12, 14, 122, 20, 18, 16 and 28 are shown separated from the layers 124, 126, 128 and 130 by an insulating layer 132 on either side thereof. The layer 122, the layer 20 and the layer 18 and the AFM layer 16 collectively comprise the MTJ of the element 120.

In the embodiment of FIG. 10, the layer 14 is shown formed on top of the BE 12 and the FL 122 is shown formed on top of the layer 14, the layer 20 is shown formed on top of the layer 122, the layer 18 is shown formed on top of the layer 20, the layer 16 is shown formed on top of the layer 18 and the layer 28 is shown formed on top of the layer 16. The SEL 126 is shown formed on top of the layer 124, which is shown formed on top of the layer 132. Similarly, the SEL 130 is shown formed on top of the layer 128, which is shown formed on top of the layer 132. The SEL 126 is shown to have a negative magnetic charge adjacent to the MTJ and an in-plane anisotropy in a direction consistent with the direction of the arrow 140. On the other hand, the SEL 130 has positive magnetic charge adjacent to the MTJ and an in-plane anisotropy in a direction consistent with the direction of the arrow 142.

As in each of the elements 10 and 30, the FL 122 has a perpendicular anisotropy, as does the layer 18. Also, the FL 122 has magnetic moments, shown by the arrows 144 that are tilted with in-plane components at the free layer's edges, as previously discussed. This is effectively done by the SELs 126 and 130, which in the element 120 are shown on the sides of the MTJ of the element 120 instead of being in or a part of the MTJ, as in each of the elements 10 and 30. Regardless, the element 120 operates in a manner analogous to the element 10, as described above.

In some embodiments, the thickness of the layer 132 is 5-20 nano meters. There is a tradeoff for making the layer 132 too large or too small in thickness and therefore a balance to be struck. It is contemplated that if the thickness of the layer 132 is made to be too large, the magneto-static field on the FL 122 from the SEL will undesirably decay, resulting in less switching current reduction. If the thickness is made too small, the process of manufacturing the element 120 will become cumbersome or even unattainable because to make a narrow layer 132 with suitable step coverage is extremely difficult without potential shorting of the MTJ and the SELs 126/130. For this reason, currently, the manufacturing of each of the elements 10 and 30 is contemplated to be easier than that of the element 120.

Similar to the element 10, while the element 120 is shown to be a "top structure", in other embodiments, it may be a "bottom structure" with the FL 122 formed on top of layer 18.

FIG. 11 shows a graph 170 of the behavior of the element 120 vs. that of a prior art magnetic memory. The graph 170 has an x-axis representing the threshold voltage, in milli Volts, and a y-axis representing the resistance, in kilo Ohms, of the MTJ of the magnetic memory whose behavior the graph 170 captures.

In the graph 170, four curves are shown: Curve 172 shows the behavior of a prior art magnetic memory with no SEL; Curve 174 shows the behavior of the curve 54 in FIG. 5 with the thickness of the SEL 26 being 3 nano meters and the Hk thereof being 5 kOe; Curve 176 shows the behavior of the curve 56 in FIG. 5 with the thickness of the SEL 26 being 5 nano meters and the Hk thereof being 5 kOe; and the curve 178 shows the behavior of the element 120 with the presence of the SEL 126, which exhibits a greater improvement over the already-improved Curves 174 and 176.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A spin transfer torque magnetic random access memory (STTMRAM) element comprising:
   a magnetic free layer and a magnetic pinned layer in contact with a tunnel barrier layer interposed therebetween, said magnetic free layer having a variable perpendicular magnetic orientation, said magnetic pinned layer having an invariable perpendicular magnetic orientation; and
   a switching-enhancing layer (SEL) separated from said magnetic free layer by a first non-magnetic spacer layer, said SEL having an invariable in-plane magnetic orientation.

2. The STTMRAM element of claim 1, wherein said magnetic free layer includes multiple ferromagnetic layers.

3. The STTMRAM element of claim 1, wherein said magnetic free layer comprises cobalt and iron.

4. The STTMRAM element of claim 1, wherein said magnetic pinned layer includes multiple ferromagnetic layers.

5. The STTMRAM element of claim 1, wherein said magnetic pinned layer comprises cobalt and iron.

6. The STTMRAM element of claim 1, wherein said magnetic pinned layer includes two ferromagnetic layers separated by a second non-magnetic spacer layer, said two ferromagnetic layers having opposite perpendicular magnetization directions.

7. The STTMRAM element of claim 1, wherein said SEL includes multiple ferromagnetic layers.

8. The STTMRAM element of claim 1, wherein said SEL includes a ferromagnetic layer and an antiferromagnetic layer formed adjacent thereto.

9. The STTMRAM element of claim 1, wherein said SEL comprises cobalt and iron.

10. The STTMRAM element of claim 1, wherein said SEL includes a first switching-enhancing sublayer (SES) and a second SES separated by a third non-magnetic spacer layer with said first SES formed adjacent to said first non-magnetic spacer layer, said first and second switching-enhancing sublayers having opposite in-plane magnetization directions.

11. The STTMRAM element of claim 10, wherein each of said first and second switching-enhancing sublayers further includes a ferromagnetic layer.

12. The STTMRAM element of claim 10, wherein said second SES further includes a ferromagnetic layer and an antiferromagnetic layer formed adjacent thereto.

13. The STTMRAM element of claim 1, wherein said first non-magnetic spacer layer comprises a metal layer and an insulator layer.

14. The STTMRAM element of claim 1, wherein said first non-magnetic spacer layer is made of an insulator material.

15. The STTMRAM element of claim 1, wherein said first non-magnetic spacer layer is made of a conductor material.

16. The STTMRAM element of claim 1, wherein said first non-magnetic spacer layer is made of Ta, Ti, Ru, Ru, Pt, Cr, Cu, or Hf.

17. The STTMRAM element of claim 1 further comprising a cap layer formed adjacent to said SEL opposite said first non-magnetic spacer layer.

18. The STTMRAM element of claim 1 further comprising a seed layer formed adjacent to said SEL opposite said first non-magnetic spacer layer.

* * * * *